United States Patent
Decker et al.

(10) Patent No.: US 8,748,797 B1
(45) Date of Patent: Jun. 10, 2014

(54) TWO WAVELENGTH RANGE PHOTODIODE DEMULTIPLEXER AND METHODS FOR USING THE SAME

(75) Inventors: Patrick Decker, Marietta, GA (US); Subhash Roy, Lexington, MA (US); Igor Zhovnirovsky, Newton, MA (US)

(73) Assignees: Applied Micro Circuits Corporation, San Diego, CA (US); Volex PLC, London (GB)

( * ) Notice: Subject to any disclaimer, the term of this patent is extended or adjusted under 35 U.S.C. 154(b) by 182 days.

(21) Appl. No.: 13/344,660

(22) Filed: Jan. 6, 2012

Related U.S. Application Data (63) Continuation-in-part of application No. 13/299,571, filed on Nov. 18, 2011, which is a continuation-in-part of application No. 13/252,923, filed on Oct. 4, 2011, which is a continuation-in-part of application No. 13/230,495, filed on Sep. 12, 2011, which is a continuation-in-part of application No. 12/900,401, filed on Oct. 7, 2010, now Pat. No. 8,057,106, which is a continuation-in-part of application No. 12/862,614, filed on Aug. 24, 2010, now Pat. No. 8,061,904, which is a continuation-in-part of application No. 12/793,513, filed on Jun. 3, 2010, which is a continuation-in-part of application No. 12/784,849, filed on May 21, 2010, now Pat. No. 8,109,676, which is a continuation-in-part of application No. 12/756,087, filed on Apr. 7, 2010, now Pat. No. 8,109,678, which is a continuation-in-part of application No. 12/652,705, filed on Jan. 5, 2010, now Pat. No. 8,109,675, which is a continuation-in-part of application No. 12/581,799, filed on Oct. 19, 2009, now Pat. No. 8,113,721, which is a continuation-in-part of application No. 12/483,616, filed on Jun. 12, 2009.

(51) Int. Cl.
H03F 3/08 (2006.01)

(52) U.S. Cl.
USPC .................................................. 250/214 R

(58) Field of Classification Search
USPC ......... 250/214 R; 257/436, 184, 440; 398/68, 398/83, 85; 370/536, 542
See application file for complete search history.

(56) References Cited

U.S. PATENT DOCUMENTS

| 7,127,133 B2* | 10/2006 | Manderscheid ................ 385/14 |
| 2006/0042677 A1* | 3/2006 | Fukunaga et al. ............ 136/243 |

OTHER PUBLICATIONS

Andrew Davidson and Robert Marsland, "Demand for high-speed detectors drives research," Apr. 1998, Laser Focus World, pp. 101-106.*

* cited by examiner

*Primary Examiner* — Thanh Luu
*Assistant Examiner* — Renee Naphas
(74) *Attorney, Agent, or Firm* — Baker & Hostetler LLP

(57) ABSTRACT

A method is provided for demultiplexing optical signals. A first photodiode accepts first optical signals in a first range of wavelengths with second optical signals in a second range of wavelengths greater than the first range. First electrical signals are generated in the first photodiode in response to the first optical signals. A second photodiode accepts the second optical signals, and generates second electrical signals in response to the second optical signals. The first photodiode substantially absorbs photons associated with the first optical signal, and substantially passes photons associated with the second optical signals. In one aspect, the first photodiode has a first coefficient of absorption associated with the first range of wavelengths and the second photodiode has a second coefficient of absorption and a half value layer (HVL) associated with the second range of wavelengths. The first photodiode has thickness less than the HVL of the second photodiode.

14 Claims, 6 Drawing Sheets

TWO WAVELENGTH RANGE PHOTODIODE DEMULTIPLEXER AND METHODS FOR USING THE SAME

RELATED APPLICATIONS

This application is a Continuation-in-Part of a application entitled, MULTIPATH COUPLING LENS SYSTEM, invented by Patrick Decker et al., Ser. No. 13/299,571, filed Nov. 18, 2011;

which is a Continuation-in-Part of a application entitled, FREE SPACE MULTIPATH LENS SYSTEM, invented by Patrick Decker et al., Ser. No. 13/252,923, filed Oct. 4, 2011;

which is a Continuation-in-Part of a application entitled, MULTIPATH LENS SYSTEM, invented by Patrick Decker et al., Ser. No. 13/230,495, filed Sep. 12, 2011;

which is a Continuation-in-Part of a application entitled, FIBER OPTIC CONNECTOR MICROLENS WITH FOCAL PLANE ALIGNING FIBER TRAP, invented by Igor Zhovnirovsky et al., Ser. No. 12/900,401, filed Oct. 7, 2010 now U.S. Pat. No. 8,057,106;

which is a Continuation-in-Part of a application entitled, FIBER OPTIC CONNECTOR MICROLENS WITH SELF-ALIGNING OPTICAL FIBER CAVITY, invented by Reid Greenberg et al., Ser. No. 12/862,614, filed Aug. 24, 2010 now U.S. Pat. No. 8,061,904;

which is a Continuation-in-Part of a pending application entitled, FIBER OPTIC JACK WITH HIGH INTERFACE MISMATCH TOLERANCE, invented by Igor Zhovnirovsky et al., Ser. No. 12/793,513, filed Jun. 3, 2010;

which is a Continuation-in-Part of a application entitled, FIBER OPTIC CABLE WITH HIGH INTERFACE MISMATCH TOLERANCE, invented by Igor Zhovnirovsky et al., Serial No. 12/784,849, filed May 21, 2010 now U.S. Pat. No. 8,109,676;

which is a Continuation-in-Part of a application entitled, PUNCH-DOWN FIBER OPTIC CABLE TERMINATION, invented by Igor Zhovnirovsky et al., Ser. No. 12/756,087, filed Apr. 7, 2010 now U.S. Pat. No. 8,109,678:

which is a Continuation-in-Part of a application entitled, CONNECTOR JACK PROCESSING BACKCAP, invented by Igor Zhovnirovsky et al., Ser. No. 12/652,705, filed Jan. 5, 2010 now U.S. Pat. No. 8,109,675:

which is a Continuation-in-Part of a application entitled, OFF-AXIS MISALIGNMENT COMPENSATING FIBER OPTIC CABLE INTERFACE, invented by Igor Zhovnirovsky et al., Ser. No. 12/581,799, filed Oct. 19, 2009 now U.S. Pat. No. 8,113,721;

which is a Continuation-in-Part of a application entitled, FIBER OPTIC CABLE INTERFACE, invented by Igor Zhovnirovsky et al., Ser. No. 12/483,616, filed Jun. 12, 2009. All the above-referenced applications are incorporated herein by reference.

BACKGROUND OF THE INVENTION

1. Field of the Invention

This invention generally relates to optical communication interfaces and, more particularly, to a photodiode demultiplexer.

2. Description of the Related Art

As noted in Wikipedia, multi-mode optical fiber is a type of optical fiber mostly used for communication over short distances, such as within a building. Typical multimode links have data rates of 10 Mbit/s to 10 Gbit/s over link lengths of up to 600 meters. The equipment used for communications over multi-mode optical fiber is much less expensive than that for single-mode optical fiber. Typical transmission speed and distance limits are 100 Mbit/s for distances up to 2 km (100BASE-FX), 1 Gbit/s to 220-550 m (1000BASE-SX), and 10 Gbit/s to 300 m (10 GBASE-SR).

Because of its high capacity and reliability, multi-mode fiber (MMF) is generally used for backbone applications in buildings. An increasing number of users are taking advantage of fiber closer to the user by running fiber to the desktop. Standards-compliant architectures such as Centralized Cabling and fiber to the telecom enclosure offer users the ability to leverage the distance capabilities of fiber by centralizing electronics in telecommunications rooms, rather than having active electronics on each floor.

Multi-mode fiber has higher "light-gathering" capacity than single-mode optical fiber. In practical terms, the larger core size simplifies connections and also allows the use of lower-cost electronics such as light-emitting diodes (LEDs) and vertical-cavity surface-emitting lasers (VCSELs) which operate at the 850 nm and 1300 nm wavelength. Single-mode fibers used in telecommunications operate at 1310 or 1550 nm and require more expensive laser sources. Single mode fibers exist for nearly all visible wavelengths of light. However, compared to single-mode fibers, the multi-mode fiber bandwidth-distance product limit is lower. Because multi-mode fiber has a larger core-size than single-mode fiber, it supports more than one propagation mode; hence it is limited by modal dispersion, while single mode is not.

The LED or VCSEL light sources sometimes used with multi-mode fiber produce a range of wavelengths and these each propagate at different speeds. In contrast, the lasers used to drive single-mode fibers produce coherent light of a single wavelength. This chromatic dispersion is another limit to the useful length for multi-mode fiber optic cable. Multi-mode fibers may have a higher numerical aperture, depending on the indices of the core and cladding, which means they are potentially better at collecting light than single-mode fibers. Because of the graded index of the core of the MMF, the numerical aperture (NA) at any given point in the core is actually a function of radial distance from the center, i.e. NA(r), such that NA goes to 0 at the core/cladding interface. The larger core size eases alignment tolerances and permits a more efficient capture of light as compared to single-mode fiber. Due to the modal dispersion in the fiber, multi-mode fiber has higher pulse spreading rates than single mode fiber (SMF), limiting multi-mode fiber's information transmission capacity. The chromatic dispersion is also much higher in MMF near 850 nanometers (nm), at about −100 ps/nm-km, vs. SMF near 1310/1550 nm, at about zero to <+20 ps/nm-km, depending on the fiber type. So the higher pulse spread, while typically dominated by the modal delay component, is also partially due to chromatic dispersion, especially for the highest grades of MMF (e.g., OM4). However, the greater light gathering capability of multi-mode fiber makes it attractive for use in commercial applications where a wider range of tolerances creates imperfect optical alignment and dispersed light beams.

The vertical-cavity surface-emitting laser (VCSEL) is a type of semiconductor laser diode with laser beam emission perpendicular from the top surface, contrary to conventional edge-emitting semiconductor lasers which emit from surfaces formed by cleaving the individual chip out of a wafer. The VCSEL has many potential advantages over the edge-emitting lasers. Its design allows chips or dies to be manufactured and tested on a single wafer. Large arrays of devices can be created exploiting methods such as flip-chip optical interconnects and optical neural network applications to become possible. In the telecommunications industry, the VCSEL's conical beam profile is desirable for coupling into optical fibers, as compared to the ellipsoidal beams typically output from edge-emitting laser. However, with these advantages come a number of problems particularly in the fabrication and operation at high powers.

A photodiode is a type of photodetector capable of converting light into either current or voltage, depending upon the mode of operation. The conventional solar cell used to generate electric solar power is a large area photodiode. Photodiodes are similar to regular semiconductor diodes except that they may be either exposed (to detect vacuum UV or X-rays), or packaged with a window or optical fiber connection to allow light to reach the sensitive part of the device. Many diodes designed for use specifically as a photodiode use a PIN junction rather than the typical p-n junction to increase the speed of response. A photodiode is designed to operate in reverse bias.

As the desired aggregate bandwidth of optical devices increases, either the throughput per fiber interface or the total number fiber interfaces must increase. The first solution requires expensive parts and complicated alignment procedures. The latter solution requires a larger interface port and a cable with more fibers, increasing the cable weight, size, and cost.

Conventional multi gigabit per second (Gbps) free-space optical interconnects use fiber-based transceivers to launch into either conventional or adaptive lens systems to produce highly collimated beams for use over distances of hundreds of meters to hundreds of miles. Such a system typically uses high-power lasers, external modulators, and active control over beam steering and shape to achieve high performance over far distances. However, the sheer complexity, size, and cost of such systems make them impossible to utilize for very high volume, very short reach consumer applications. These applications then typically resort to either the use of cables to make a physical connection, or increasingly use omnidirectional wireless standards, such as WiFi, Bluetooth, etc., which have a number of disadvantages, such as low throughput (compared to 1 Gbps) and the requirements of compensating for multipath interference and competition between devices for use of a limited bandwidth space, which arise due to their omnidirectionality and their use of radio frequency radiation. Some approaches also multicast optical signals using highly-divergent beams or beaconing structures.

Wavelength Division Multiplexing (WDM) is the transmission of multiple separately encoded channels at distinct wavelengths through the same waveguide or component. Current WDM demultiplexers are typically stand-alone devices with fiber inputs/outputs. Common approaches typically utilize either arrayed waveguide gratings, free-space gratings+ micro-electromechanical (MEMS) devices, or other dispersive elements, in order to spatially disperse the different wavelengths and then couple them to/from separate waveguides. Alternatively, a filter and optical circulator are used to add or drop single wavelengths. These solutions tend to be large compared to a photodiode and require coupling to additional fibers, which results in excess loss and the full cost of the assembly. Consequently, these solutions are reserved for applications in which single-mode optics and fibers are employed, in which performance requirements dominate over cost due to the comparatively low number of links, compared to MMF link environments.

MMF links between optical modules, or within an optical cable, conventionally use each fiber for transmission in only one direction. This is because the use of fiber couplers after launch into the fiber introduces high optical losses while also potentially coupling large amounts of power back into the VCSEL, which cannot use optical isolators due to the multi-mode nature of the system. A large number of fibers adds weight, cost, and complexity.

The attenuation coefficient is a quantity that characterizes how easily a material or medium can be penetrated by a beam of light. A large attenuation coefficient means that the beam is quickly "attenuated" (weakened) as it passes through the medium, and a small attenuation coefficient means that the medium is relatively transparent to the beam. Attenuation coefficient is measured using units of reciprocal length. The attenuation coefficient is also called linear attenuation coefficient, narrow beam attenuation coefficient, or absorption coefficient.

The attenuation coefficient describes the extent to which the intensity of an energy beam is reduced as it passes through a specific material. This might be a beam of electromagnetic radiation. A small linear attenuation coefficient indicates that the material in question is relatively transparent, while a larger value indicates greater degrees of opacity or non-transparency. The linear attenuation coefficient is dependent upon the type of material and the energy of the radiation. Generally, for electromagnetic radiation, the higher the energy of the incident photons and the less dense the material in question, the lower the corresponding linear attenuation coefficient will be.

The measured intensity (I) transmitted through a layer of material with thickness x is related to the incident intensity $I_0$ according to the inverse exponential power law that is usually referred to as Beer-Lambert law:

$$I = I_0 e^{-\alpha x},$$

where x denotes the path length. The attenuation coefficient (or linear attenuation coefficient) is $\alpha$.

The Half Value Layer (HVL) signifies the thickness of a material required to reduce the intensity of the emergent radiation to half its incident magnitude. The attenuation factor of a material is obtained by the ratio of the emergent and incident radiation intensities $I/I_0$.

When a narrow (collimated) beam of light passes through a substance, the beam will lose intensity due to two processes: The light can be absorbed by the substance, or the light can be scattered (i.e., the photons can change direction) by the substance. Just looking at the narrow beam itself, the two processes cannot be distinguished. However, if a detector is set up to measure light leaving in different directions, or conversely using a non-narrow beam, one can measure how much of the lost intensity was scattered, and how much was absorbed.

In this context, the "absorption coefficient" measures how quickly the beam would lose intensity due to the absorption alone, while "attenuation coefficient" measures the total loss of narrow-beam intensity, including scattering as well. "Narrow-beam attenuation coefficient" always unambiguously refers to the latter. The attenuation coefficient is always larger than the absorption coefficient, although they are equal in the idealized case of no scattering.

It would be advantageous if the number of fibers required for the same aggregate bandwidth could be reduced without requiring the use of optical modulation schemes.

SUMMARY OF THE INVENTION

Disclosed herein are a system and method that permit the demultiplexing of optical signals with multiple source wavelengths from a single fiber or waveguide into separate photodiodes in a compact, co-linear arrangement. This system replaces the need for fiber- or waveguide-based couplers for constructing demultiplexers to route different wavelength signals to different photodiodes. The system allows for use of existing optical lens assemblies built for single-wavelength, single-photodiode solutions with only minor modifications. Further, modifications to conventional photodiodes that enable the demultiplexing system are based upon well-understood, deployed high-volume systems.

Accordingly, a method is provided for demultiplexing optical signals. A first photodiode accepts first optical signals in a first range of wavelengths with second optical signals in a second range of wavelengths greater than the first range. First electrical signals are generated in the first photodiode in response to the first optical signals. A second photodiode accepts the second optical signals, and generates second electrical signals in response to the second optical signals. The first photodiode substantially absorbs photons associated with the first optical signal, and substantially passes photons associated with the second optical signals.

In one aspect, the first photodiode overlies the second photodiode. The first photodiode has a first coefficient of absorption associated with the first range of wavelengths and the second photodiode has a second coefficient of absorption and a half value layer (HVL) associated with the second range of wavelengths. The first photodiode has thickness less than the HVL of the second photodiode.

Additional details of the above-described method, a photodiode demultiplexer, and a system using a multipath coupling lens and photodiode demultiplexer are provided below.

DETAILED DESCRIPTION

Figures 1A, 1B, 2:
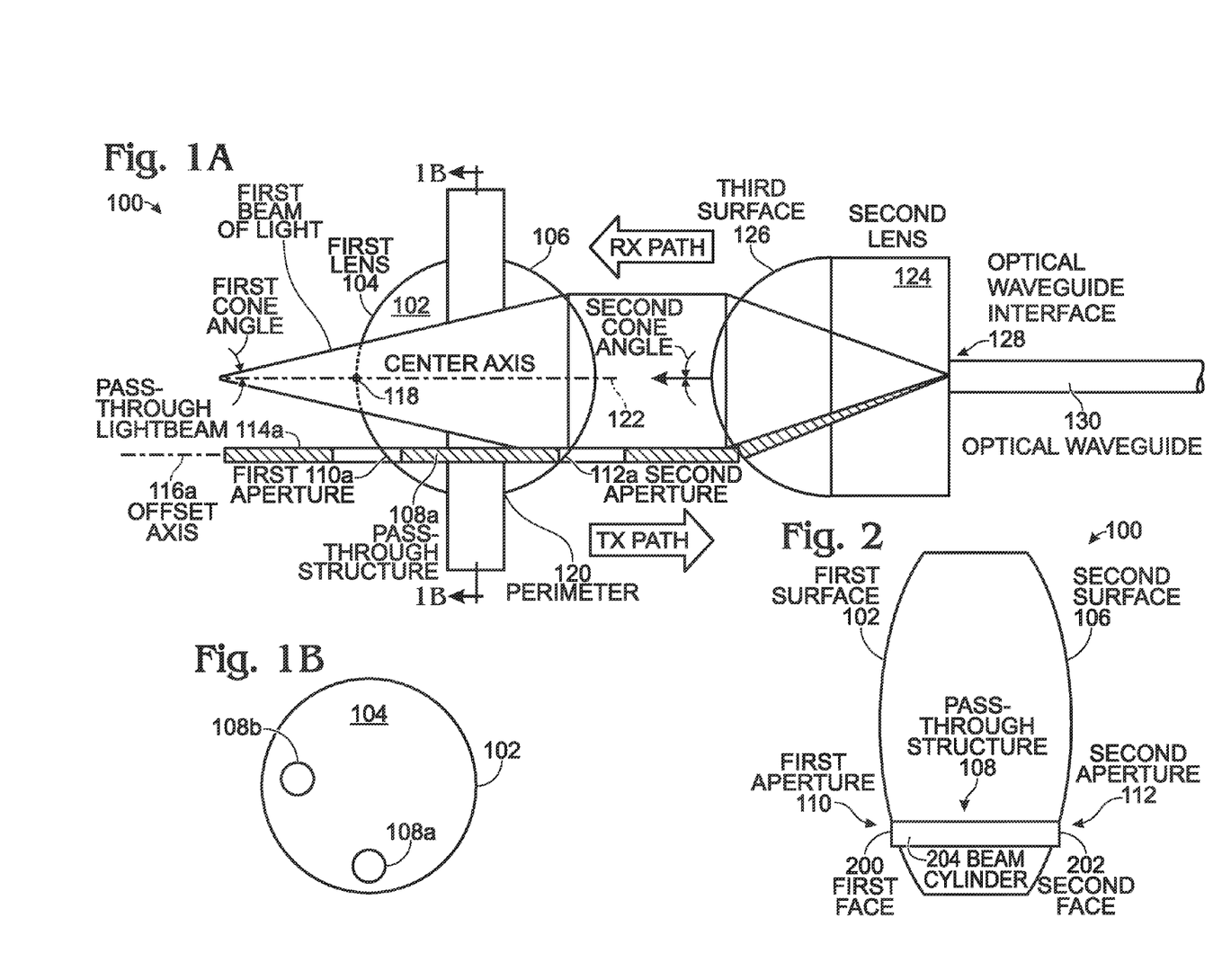
FIGS. 1A and 1B are partial cross-sectional views depicting a multipath coupling lens system.
FIG. 2 is a partial cross-sectional view depicting a variation of the pass-through structure.

FIGS. 1A and 1B are partial cross-sectional views depicting a multipath coupling lens system. The system 100 comprises a first lens 102 comprising a first surface 104 and a second surface 106. The first lens further comprises a plurality of pass-through structures 108. Shown are pass-through structures 108a and 108b, but the first lens 102 is not limited to any particular number of pass-through structures. Each pass-through structure 108 is formed between the first lens first surface 104 and second surface 106. Each pass-through structure 108 has a first aperture 110 formed in the first surface 104 to accept a pass-through beam of light 114 and a second aperture 112 formed in the second surface 106 to transmit the pass-through beam of light 114 into free space. Each pass-through structure 108 is formed along a corresponding offset axis 116 located between the first surface center 118 and a first surface perimeter 120.

In one aspect, each pass-through structure 108 is a cylindrical cavity formed between the first surface 104 and the second surface 106. That is, the pass-through structure is a hole through the first lens 102.

FIG. 2 is a partial cross-sectional view depicting a variation of the pass-through structure. In this aspect, the pass-through structures are simply flattened (less curved) regions of the first and second lens surfaces. That is, the first aperture 110 of each pass-through structure 108 is a first face 200 formed in the first surface 104. Likewise, the second aperture 112 of each pass-through structure 108 is a second face 202 formed in the second surface 106. Then, each pass-through structure further comprises a beam cylinder 204 between the first and second surfaces, normal in orientation, or substantially normal to both the first face 200 and second face 202. The beam cylinder may be considered substantially normal if it is only truly normal to one particular point along the first and second faces.

Returning to FIG. 1A, in one aspect the first lens first surface 104 transmits a first beam of light via a path formed in a cone and having a first cone angle, where the first cone angle is defined with respect to a center axis 122 of the path projected into free space from the first surface. The first lens second surface 106 accepts the first beam of light via a path formed in a cone having a second cone angle less than the first cone angle, where the second cone angle is defined with respect to a center axis of the path projected into free space from the second surface.

The average position of the center axis within each transverse plane may be defined by the centroid (geometric center) of the beam within that plane. The line called the center axis may then be described via a linear fit to the collection of points comprised of the centroids measured in multiple parallel planes.

As is well known, if beams are known in advance to be simple Gaussians then parameters like $1/e^2$ width or full-width-half-maximum intensity points can be used to characterize the beam size. However, if a beam is not Gaussian, or has been aberrated or truncated by propagation through an optical system, intensity points may not be useful indicators of beam width. If a beam has the irradiance distribution I(x,y), the irradiance of a complex amplitude distribution may be defined as I=E.E*, where E* represents the complex conjugate of the field. The first moment of this arbitrary beam is called the beam centroid and represents the 'center of mass' of the beam on the optical surface.

Figure 3:
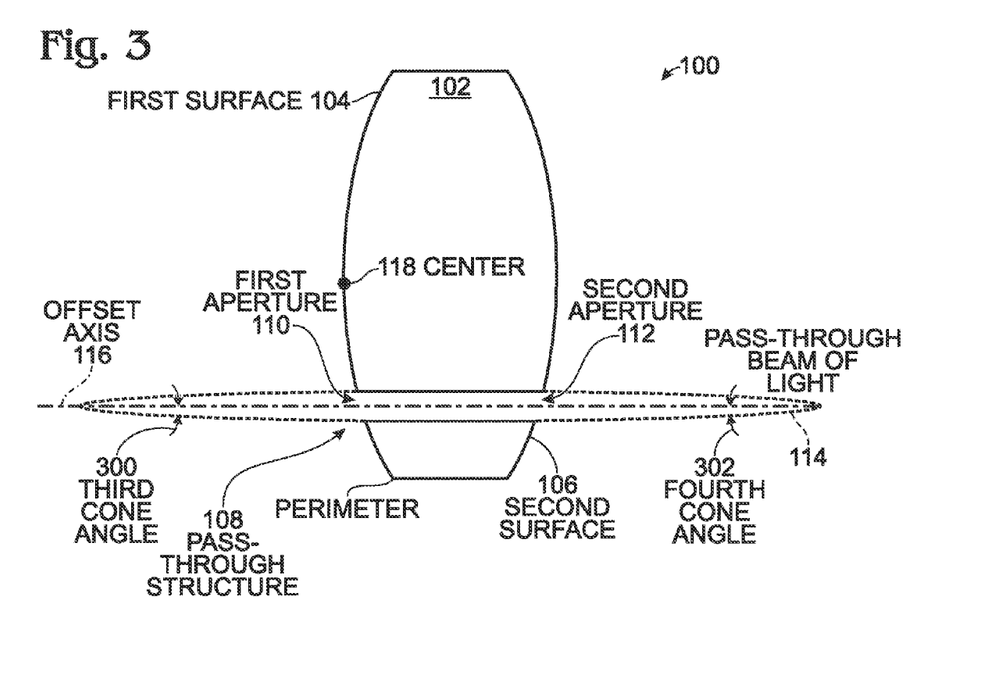
FIG. 3 is a partial cross-sectional view depicting another feature of the multipath coupling lens system.

FIG. 3 is a partial cross-sectional view depicting another feature of the multipath coupling lens system. In this aspect, the first aperture 110 of each pass-through structure 108 accepts a pass-through beam of light 114 via a path formed in a cone having a third cone angle 300, where the third cone angle is defined with respect to a center axis of the path projected into free space from the first aperture. As shown, the center axis is the offset axis 116. Each pass-through structure second aperture 112 transmits the pass-through beam of light 114 formed in a cone having a fourth angle 302, where the fourth cone angle is defined with respect to a center axis of the path projected into free space from the second aperture. Again, the center axis for the second aperture is the offset axis. However, it should be understood that the center axis defined with respect to the first aperture and the center axis defined with respect to the second aperture need not necessarily be identical to the offset axes. Details concerning the radii of curvature can be found in parent application Ser. No. 13/252,923, filed Oct. 4, 2011, and Ser. No. 13/230,495, filed Sep. 12, 2011, which are incorporated by reference.

Returning to FIG. 1A, in another aspect the multipath coupling lens system further comprises a second lens 124. The second lens 124 comprises a third surface 126 to accept the plurality of pass-through beams of light transmitted from the plurality of pass-through structure second apertures 112. An optical waveguide interface 128 transmits the plurality of pass-through beams of light received at the third surface 126 as a summed optical signal, into an optical waveguide 130.

Figure 4:
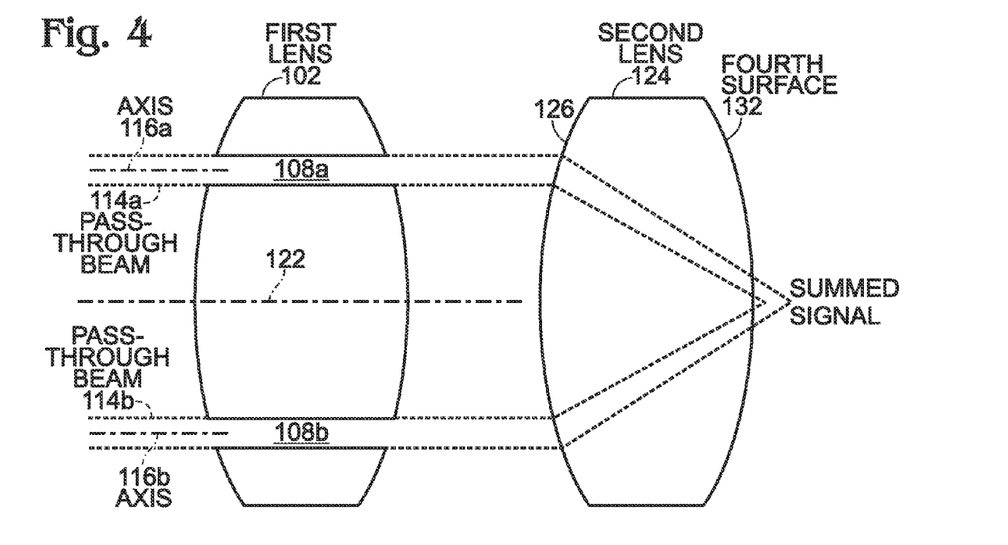
FIG. 4 is a partial cross-sectional view depicting a free space alternative to the waveguide interface of FIG. 1A.

FIG. 4 is a partial cross-sectional view depicting a free space alternative to the waveguide interface of FIG. 1A. In this aspect, the second lens 124 comprises the third surface 126, as described above, and a fourth surface 132 to transmit the plurality of pass-through beams of light received at the third surface, as a summed optical signal into free space. Note: the fourth surface 132 also receives the first beam of light that is transmitted to the first lens 102 via the third surface 126.

Figure 5:
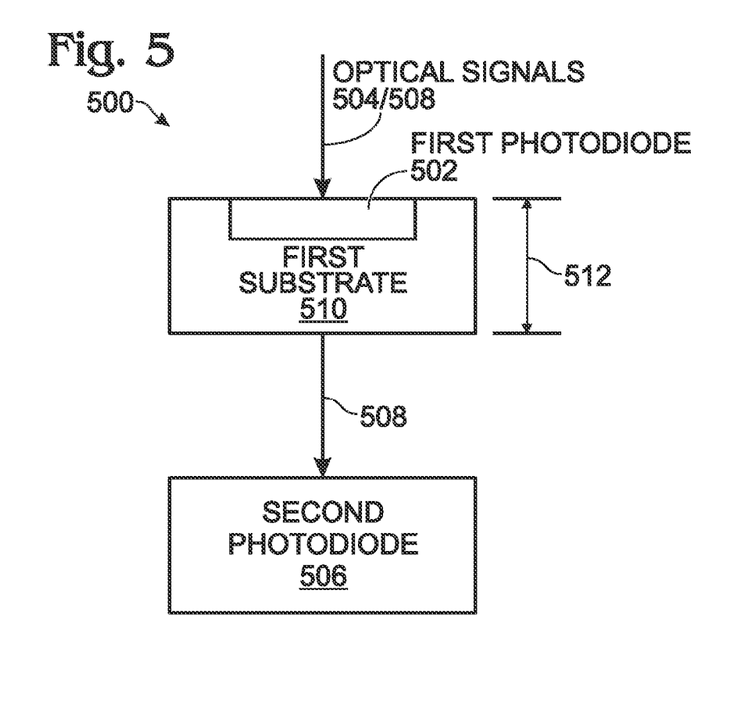
FIG. 5 is a partial cross-sectional view of a photodiode demultiplexer.

FIG. 5 is a partial cross-sectional view of a photodiode demultiplexer. The photodiode demultiplexer 500 comprises a first photodiode 502 to accept optical signals 504 in a first range of wavelengths. A second photodiode 506 underlying the first photodiode 502 accepts optical signals 508 in a second range of wavelengths, longer than the first range. The first photodiode 502 substantially absorbs photons associated with the first optical signal, and substantially passes photons associated with the second optical signals. The definition of "substantially" depends upon a number of design-specific characteristics, such as wavelength, separation between the first and second ranges of wavelength, the semiconductor materials used, semiconductor material thicknesses, and the required magnitude of the electrical signals, to name a few. As a very general rule, the first photodiode absorbs greater than 50% of the photons in the first range of wavelengths, and passes greater than 50% of photons in the second range of wavelengths.

In one aspect, the first photodiode is formed in a first substrate 510 having a first coefficient of absorption associated with the first range of wavelengths, and a first thickness 512. The second photodiode 506 has a second coefficient of absorption and a half value layer (HVL) associated with the second range of wavelengths, where the HVL is greater than the first substrate first thickness 512. For example, the first photodiode 502 may be a gallium arsenide (GaAs) photodiode, and the second photodiode 506 may be made from indium gallium arsenide (InGaAs). In another example, the first photodiode 502 is made from GaAs, and the second photodiode is a silicon/germanium (SiGe) photodiode. In another aspect, the first photodiode is SiGe and the second photodiode is InGaAs. More explicitly, the absorption coefficient for GaAs at 890 being is significant, so in combination with a InGaAs second photodiode, first/second wavelengths of 850/980 nm or 850/1060 nm would be useful, or 850/1310 nm would be useful in a MMF optimized for 1310 nm, specifically an OM1 62.5 um core MMF. For a passive optical network (PON) demultiplexer application, first/second wavelengths of 1310/1550 nm would be useful. In the case of a first photodiode of GaAs and a SiGe second photodiode, first/second wavelengths of 850/1310 nm would be useful.

Figure 6:
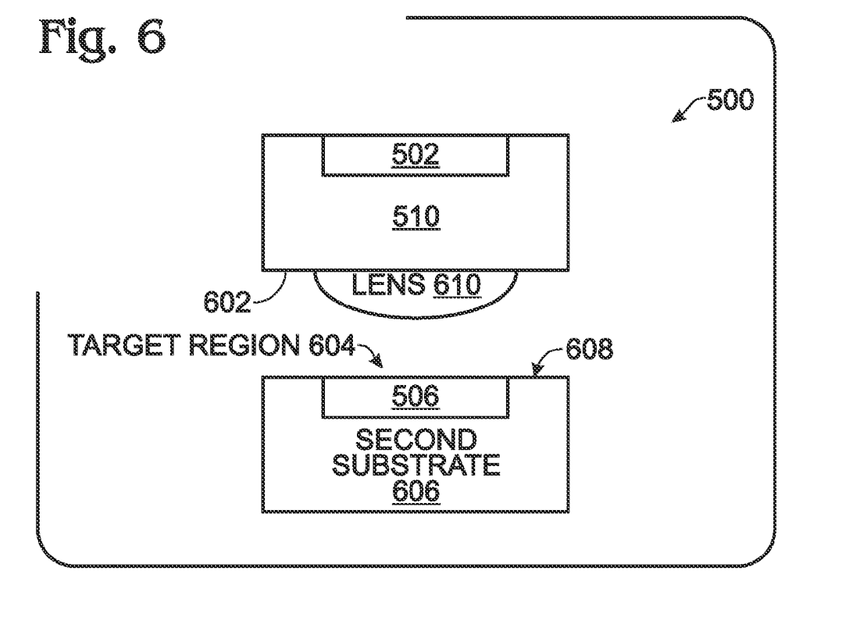
FIG. 6 is a partial cross-sectional view showing a variation of the photodiode demultiplexer of FIG. 5.

FIG. 6 is a partial cross-sectional view showing a variation of the photodiode demultiplexer of FIG. 5. In one aspect, the first photodiode 502 is formed in the first substrate 510 with a bottom surface 602 overlying the second photodiode 506. The second photodiode 506 is formed in a target region 604 on a second substrate 606 having a top surface 608. A lens 610 is formed on the first substrate bottom surface 602, configured to focus the second optical signals 508 passing through the first photodiode 502 on the target region 604 of the second photodiode 506. The lens 610 may be integrally formed by shaping the first substrate bottom surface 602, or by attaching a separate lens structure to the bottom surface 602. It should be understood that the photodiodes may be formed in the top surfaces of their respective substrate, and that the photodiode may comprise a relatively insignificant part of the overall substrate thickness. Typically, a photodiode is formed as a PIN junction using thin film processes that are well known in the art. The demultiplexer is not limited to any particular type of photodiode.

Figure 7A:
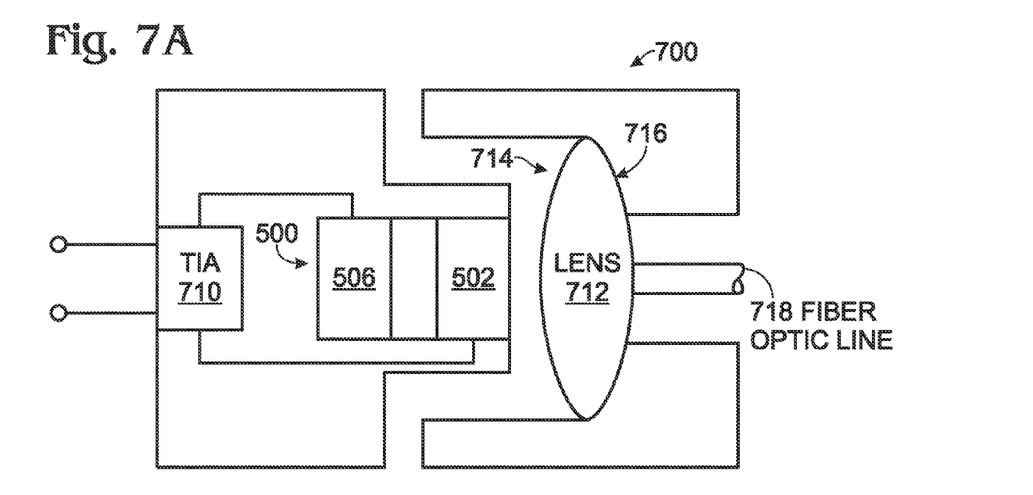
FIG. 7A is a partial cross-sectional view of a photodiode demultiplexer as employed in a receiver optical sub-assembly (ROSA).

FIG. 7A is a partial cross-sectional view of a photodiode demultiplexer as employed in a receiver optical sub-assembly (ROSA). The system 700 comprises a lens 712 with a first surface 714 and a second surface 716. A first photodiode 502 of the photodiode demultiplexer 500 accepts optical signals from the lens first surface 714 in a first range of wavelengths. A second photodiode 506 underlying the first photodiode 502 accept optical signals in a second range of wavelengths, longer than the first range, from the lens first surface. Additional details of photodiodes 502 and 506, described above as a photodiode demultiplexer 500, are not repeated here in the interest of brevity.

As shown, the ROSA may be connectorized system with a lens 712, the photodiode demultiplexer 500, and a transimpedance amplifier (TIA) 710. The figure also shows a fiber optical line 718 to carry the first and second range of wavelengths of optical signals. The fiber optic line may be a multimode or single mode fiber type.

Figure 7B:
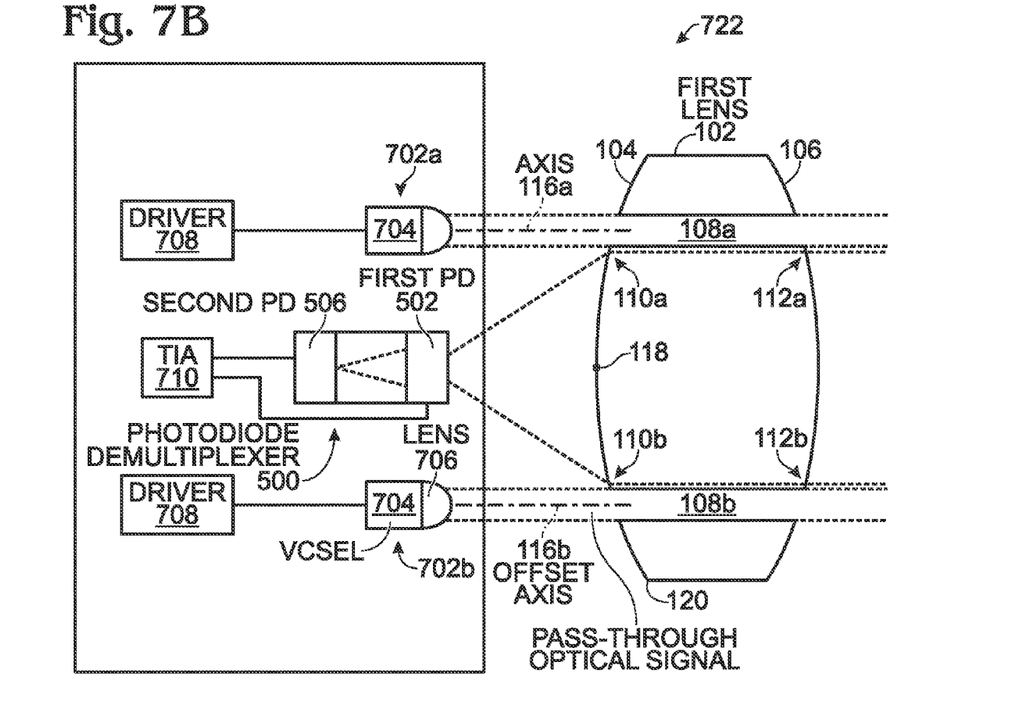
FIG. 7B is a partial cross-sectional view depicting a system employing a multipath coupled lens and a photodiode demultiplexer.

FIG. 7B is a partial cross-sectional view depicting a system employing a multipath coupled lens and a photodiode demultiplexer. As in FIG. 7A, the system 722 comprises a lens 102 with a first surface 104 and a second surface 106. A first photodiode 502 of the photodiode demultiplexer 500 accepts optical signals from the lens first surface 104 in a first range of wavelengths. A second photodiode 506 underlying the first photodiode 502 accept optical signals in a second range of wavelengths, longer than the first range, from the lens first surface. Additional details of photodiodes 502 and 506, described above as a photodiode demultiplexer 500, are not repeated here in the interest of brevity.

In this aspect the lens 102 includes two pass-through structures 108a and 108b. Each pass-through structure is formed between the lens first surface 104 and second surfaces 106. Each pass-through structure having a first aperture 110a/110b formed in the first surface 104 to accept a pass-through beam of light and a second aperture 112a/112b formed in the second surface 106 to transmit the pass-through beam of light into free space. Further, each pass-through structure is formed along a corresponding offset axis 116a/116b located between the first surface center 118 and a first surface perimeter 120.

The system 722 may further comprise two light sources. Shown are light sources 702a and 702b, but it should be understood that the system is not limited to any particular number of light sources. As shown, each light source may be comprised of a vertical-cavity surface-emitting laser (VCSEL) 704 and a lens 706 integrally formed overlying the VCSEL optical interface. Such a light source is capable of creating a collimated or substantially collimated beam of light. However, the systems disclosed herein are not limited to any particular type of light source. Each light source transmits a corresponding pass-through optical signal into free space.

Each light source may be connected to a driver 708. Each photodiode 502 and 506 may be connected to a transimpedance amplifier 710 (TIA) to amplify the electrical signals generated by the photodiodes.

The systems described in FIGS. 1A through 7B permit the use of bidirectional MMF fiber with inexpensive coupling optics, as opposed to conventional duplex fiber cords, or the use of fiber-based fused-silica couplers which must be inserted after launch into the fiber.

In order to allow both the transmit and receive paths to use the same fiber, they must use the same lenses, and the VCSELs are positioned around the photodiodes. Furthermore, to make sure that the transmit beam is within the acceptance cone of the fiber, the transmit beam travels within the same volume as the receive beam emitted from the fiber. To accomplish this, firstly the VCSEL output may be collimated via a directly-attached lens. Then, the lens is modified by either having a hole drilled thru it, or by altering a small area of the lens to be flat, in order to allow the collimated VCSEL beam to pass through the lens without being defocused. In this way, the transmit path shares the same footprint as the receive path, and can use the same single fiber, which operates bidirectionally.

Although not shown, the system described above may comprise a plurality electro/optical and lenses, aligned in columns, in rows, or in both columns and rows (see FIGS. 8A and 8B of parent application Ser. No. 13/252,923 for a conceptually similar arrangement). In order to allow for both the "transmit" and "receive" paths to use the same optical axis, they may use similar architectures, with the VCSELs positioned around the photodiodes in each electro/optical module. Ideally, care may be taken to prevent the two VCSEL beams from opposite ends of the link from shining at each other. For example, this may be accomplished by breaking the symmetry between the two devices or by providing a mechanical keying system within the mating structure.

The above-described systems may further be used to communicate pulse amplitude modulation-4 (PAM-4) signals using two separate VCSELs. Using simple on-off keying (OOK) where one VCSEL is modulated at half the amplitude of the other VCSEL, such as system can be enabled using off-the-shelf VCSEL drivers without a PAM-4 encoder.

Using additional VCSELs, this concept can be extended to any multilevel PAM system, depending on the tradeoffs being made with respect to lens size, coupling efficiencies, and encoder/driver electronics. Another application is discrete multi-tone (DMT) modulation, which is similar to OFDM, but uses real-valued signals rather than complex ones. DMT has been shown to work over MMF using a VCSEL at multi-Gb/s throughputs. Thus, multiple VCSELs can be used to extend the dynamic range of the system to allow for higher aggregate bitrates. However, the range of input currents over which a VCSEL is linear is limited due to physical processes, especially due to thermal effects upon lasing.

In other scenarios it may be useful to drive PAM-5 (or some order of PAM greater than PAM-4) using just two VCSELS, to balance the cost/efficiency of adding more VCSELs vs. adding more levels per VCSEL. For example, PAM-5 may be enabled with amplitudes of [0, 0.5, 1, 1.5, 2] using two VCSELs (one OOK and one PAM-3), as compared to the amplitudes of [0, 0.75, 1.5, 2.25, 3] using 3 VCSELs. In either approach, at least one VCSEL is driven as something other than OOK. Practically, PAM has diminishing returns as the number of levels is increased.

Advantageously, the systems of FIGS. 7A and 7B are able to demultiplex a 2-channel WDM system, using the photodiode demultiplexer, without requiring the use of the above-presented modulation formats. However, the system bandwidth can be increased by combining the use of a modulation scheme with the photodiode demultiplexer.

Figure 8:
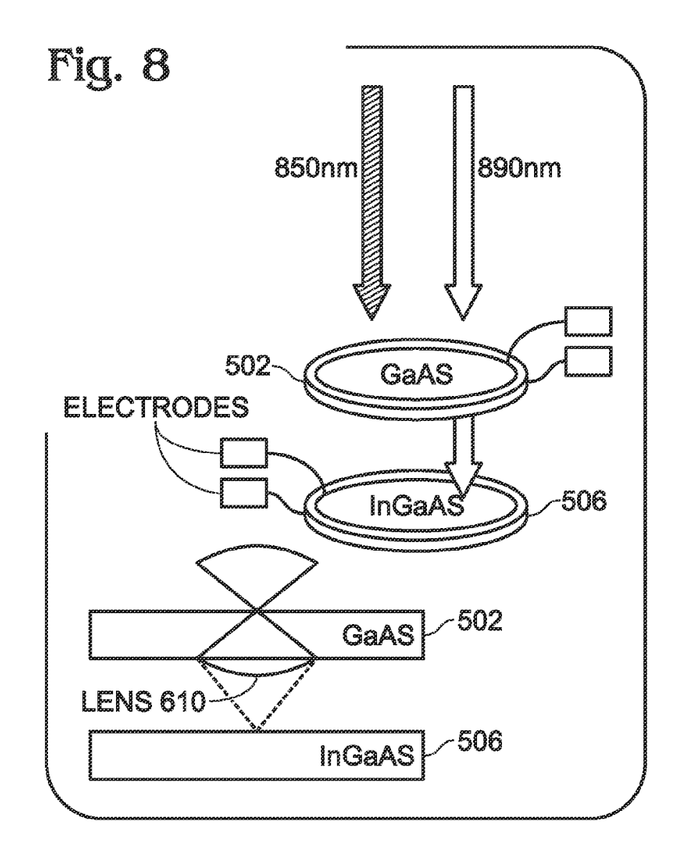
FIG. 8 is a schematic diagram depicting another aspect of the photodiode demultiplexer of FIG. 5.

FIG. 8 is a schematic diagram depicting another aspect of the photodiode demultiplexer of FIG. 5. In the stacked-photodiode arrangement, the top photodiode 502, which may be primarily composed of gallium-arsenide (GaAs), is designed to detect light at a shorter wavelength than that of the bottom photodiode, and is unable to efficiently detect light with a significantly longer wavelength. The longer-wavelength light passes thru the top photodiode 502, with some loss, and is then coupled into the bottom photodiode 506, which is designed in a different material system in order to be able to detect the longer wavelength light, e.g. indium-gallium-arsenide (InGaAs). The top photodiode 502 is processed in order to reduce its thickness, minimizing the amount of absorption of the longer-wavelength light, for although the absorption depth (at which the bulk of the light has been absorbed) can be 50 times larger for the longer wave light, this can still be short enough to be absorbed within the bulk of the chip (instead of within the PIN junction of the photodiode in which useful photocurrent is generated by the absorption of the shorter wavelength light).

Figure 9:
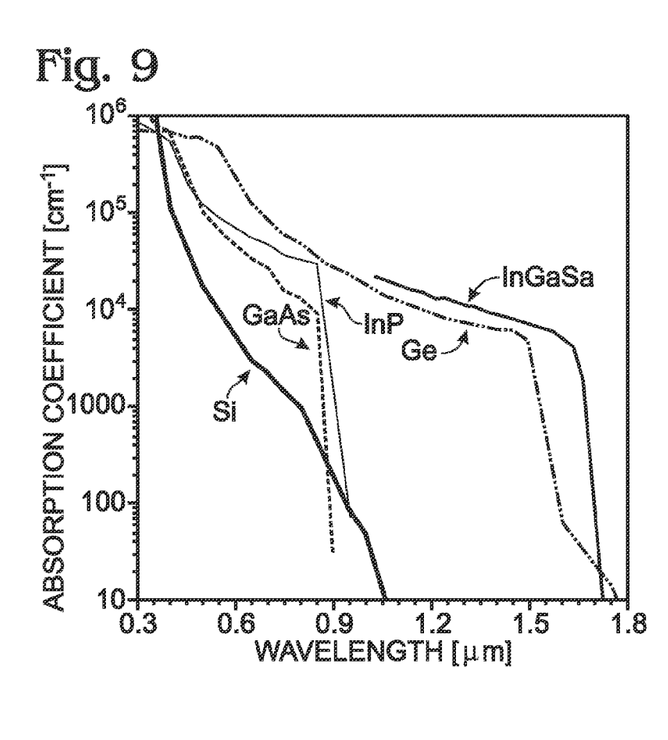
FIG. 9 is a graph of the absorption coefficients for a variety of semiconductor materials vs. wavelength.

FIG. 9 is a graph of the absorption coefficients for a variety of semiconductor materials vs. wavelength. For example, GaAs has an absorption coefficient of 12161 per centimeter ($cm^{-1}$) and a ($1/e^{-\alpha x}$) depth of 0.822 microns at 850 nanometers (nm). The same material has a coefficient of 241 $cm^{-1}$ and a ($1/e^{-\alpha x}$) depth of 41.49 microns at 890 nm. Knowing this information, the first diode substrate can be made thick enough to absorb a significant amount of light energy at 850 nm, while passing a significant amount of light energy at 890 nm.

Returning to FIG. 8, the thinning of the top photodiode 502 allows for easier use of a small lens 610 between the top and bottom photodiodes, designed to refocus the light onto the bottom PD. Thinning processes are able to reduce substrates to an overall thickness of less than 100 microns using polishing techniques. Otherwise, a lens might be formed in a substrate using a chemical etching process. This light may be focused onto the aperture of the top surface of the top PD but spread out as it exits the top PD. The process for thinning and attaching a microlens could be based upon that used to attach lenses to CCD arrays for cameras such as used in a smartphone, and as such would be high-volume compatible. An alternative approach might thin the wafer and then construct a polymer lens directly upon the back-side of the wafer. A third approach might form the lens via a series of etch steps to progressively form the lens out of the bulk of the wafer.

Figure 10:
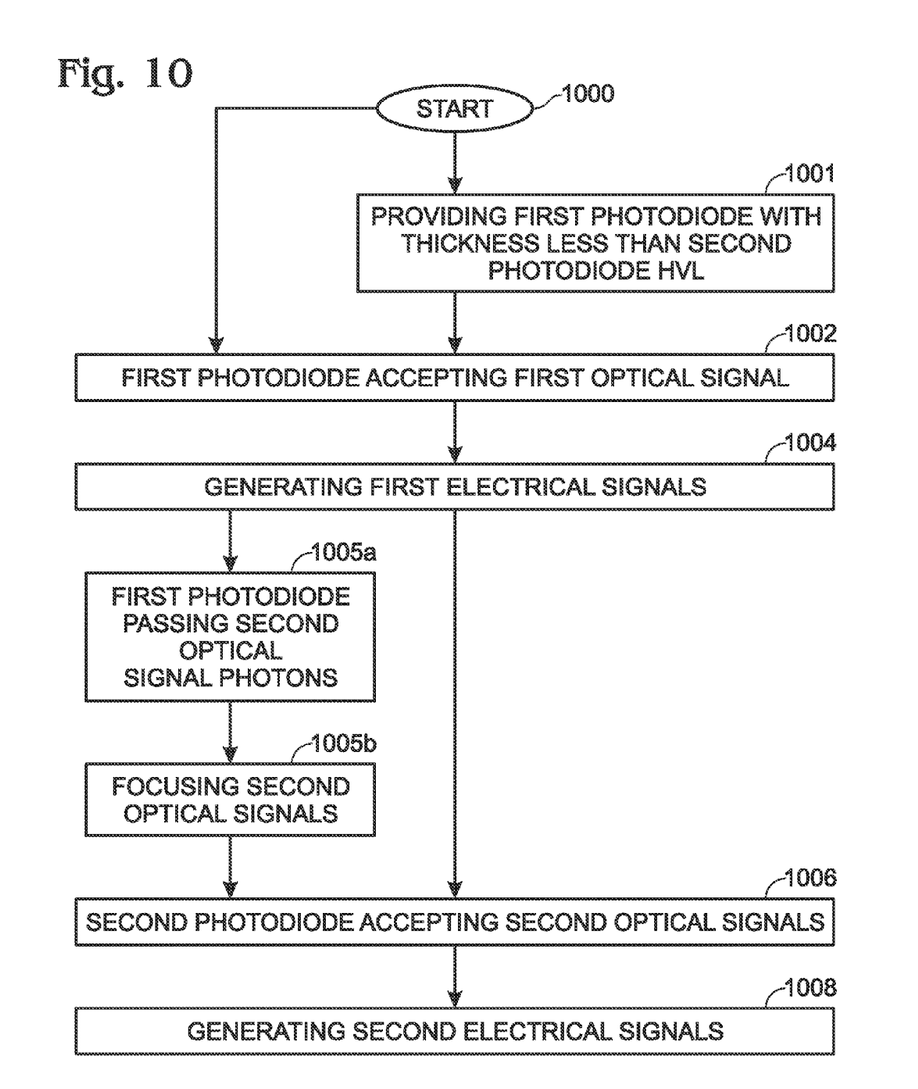
FIG. 10 is a flowchart illustrating a method for demultiplexing optical signals.

FIG. 10 is a flowchart illustrating a method for demultiplexing optical signals. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps. The method starts at Step 1000.

In Step 1002 a first photodiode accepts first optical signals in a first range of wavelengths with second optical signals in a second range of wavelengths greater than the first range. Step 1004 generates first electrical signals in the first photodiode in response to the first optical signals. In Step 1006 a second photodiode accepts the second optical signals. Step 1008 generates second electrical signals in the second photodiode in response to the second optical signals. For example, in Step 1002 a gallium arsenide (GaAs) photodiode may accept the first optical signal and in Step 1006 an indium gallium arsenide (InGaAs) photodiode may accept the second optical signal. Alternatively, in Step 1002 a GaAs photodiode accepting the first optical signal and in Step 1006 a silicon/germanium (SiGe) photodiode accepts the second optical signal.

In one aspect, generating the first electrical signals in Step 1004 includes the first photodiode substantially absorbing photons associated with the first optical signal. In Step 1005*a* the first photodiode substantially passes photons associated with the second optical signals. Step 1005*b* focuses the second optical signals passing through the first photodiode on a target region of the second photodiode (e.g., using a lens).

In another aspect, Step 1001 provides the first photodiode overlying the second photodiode, where the first photodiode has a first coefficient of absorption associated with the first range of wavelengths and the second photodiode has a second coefficient of absorption and a half value layer (HVL) associated with the second range of wavelengths. The first photodiode has thickness less than the HVL of the second photodiode.

A photodiode demultiplexer has been provided along with a communication system enabled using the photodiode demultiplexer and a multipath coupled lens system. Examples of particular semiconductor materials and geometries have been presented to illustrate the invention. However, the invention is not limited to merely these examples. Other variations and embodiments of the invention will occur to those skilled in the art.

We claim:

1. A method for demultiplexing optical signals, the method comprising:
    a first photodiode accepting first optical signals in a first range of wavelengths with second optical signals in a second range of wavelengths greater than the first range;
    generating first electrical signals in the first photodiode in response to the optical signals in the first range;
    a second photodiode accepting the optical signals in the second range;
    providing the first photodiode overlying the second photodiode, where the first photodiode has a first coefficient of absorption associated with the first range of wavelengths and the second photodiode has a second coefficient of absorption and a half value layer (HVL) associated with the second range of wavelengths, and wherein the first photodiode has thickness less than the HVL of the second photodiode; and
    generating second electrical signals in the second photodiode in response to the second optical signals.

2. The method of claim 1 wherein generating the first electrical signals includes the first photodiode substantially absorbing photons associated with the optical signals in the first range; and,
    the method further comprising:
    the first photodiode substantially passing photons associated with the optical signals in the second range.

3. The method of claim 2 further comprising:
    focusing the optical signals in the second range passing through the first photodiode on a target region of the second photodiode.

4. The method of claim 1 wherein accepting the optical signals in the first range includes a gallium arsenide (GaAs) photodiode accepting the optical signals in the first range; and,
    wherein accepting the optical signals in the second range includes an indium gallium arsenide (InGaAs) photodiode accepting the optical signals in the second range.

5. The method of claim 1 wherein accepting the optical signals in the first range includes a GaAs photodiode accepting the optical signals in the first range; and,
    wherein accepting the optical signals in the second range includes a silicon/germanium (SiGe) photodiode accepting the optical signals in the second range.

6. A photodiode demultiplexer comprising:
    a first photodiode to accept optical signals in a first range of wavelengths;
    a second photodiode underlying the first photodiode to accept optical signals in a second range of wavelengths, longer than the first range;
    wherein the first photodiode substantially absorbs photons associated with the optical signals in the first range and substantially passes photons associated with the optical signals in the second range;
    wherein the first photodiode is formed in a first substrate with a bottom surface overlying the second photodiode;
    wherein the second photodiode is formed in a target region on a second substrate having a top surface; and
    the photodiode demultiplexer further comprising:
        a lens formed on the first substrate bottom surface, configured to focus the optical signals in the second range passing through the first photodiode on the target region of the second photodiode.

7. The photodiode demultiplexer of claim 6 wherein the first photodiode is a gallium arsenide (GaAs) photodiode; and,
    wherein the second photodiode is an indium gallium arsenide (InGaAs) photodiode.

8. The photodiode demultiplexer of claim 6 wherein the first photodiode is a GaAs photodiode; and,
    wherein the second photodiode is a silicon/germanium (SiGe) photodiode.

9. A photodiode demultiplexer comprising:
    a first photodiode to accept optical signals in a first range of wavelengths, wherein the first photodiode is formed in a first substrate having a first coefficient of absorption associated with the first range of wavelengths, and a first thickness; and
    a second photodiode underlying the first photodiode to accept optical signals in a second range of wavelengths, longer than the first range, wherein the second photodiode has a second coefficient of absorption and a half value layer (HVL) associated with the second range of wavelengths, where the HVL is greater than the first substrate first thickness.

10. A system employing a multipath coupled lens and a photodiode demultiplexer, the system comprising:
    a lens comprising:
        a first surface;
        a second surface;
    a first photodiode to accept optical signals from the lens first surface in a first range of wavelengths;
    a second photodiode underlying the first photodiode to accept optical signals in a second range of wavelengths, longer than the first range, from the lens first surface;
    wherein the first photodiode substantially absorbs photons associated with the optical signals in the first range, and substantially passes photons associated with the optical signals in the second range;
    wherein the first photodiode is formed in a first substrate with a bottom surface overlying the second photodiode;
    wherein the second photodiode is formed in a target region on a second substrate having a top surface; and, the photodiode demultiplexer further comprising:
a lens formed on the first substrate bottom surface, configured to focus the optical signals in the second range passing through the first photodiode on the target region of the second photodiode.

11. The system of claim 10 wherein the first photodiode is a gallium arsenide (GaAs) photodiode; and,
wherein the second photodiode is an indium gallium arsenide (InGaAs) photodiode.

12. The system of claim 10 wherein the first photodiode is a GaAs photodiode; and,
wherein the second photodiode is a silicon/germanium (SiGe) photodiode.

13. A system employing a multipath coupled lens and a photodiode demultiplexer, the system comprising:
a lens comprising:
a first surface;
a second surface;
a first photodiode to accept optical signals from the lens first surface in a first range of wavelengths;
a second photodiode underlying the first photodiode to accept optical signals in a second range of wavelengths, longer than the first range, from the lens first surface;
wherein the first photodiode is formed in a first substrate having a first coefficient of absorption associated with the first range of wavelengths, and a first thickness; and
wherein the second photodiode has a second coefficient of absorption and a half value layer (HVL) associated with the second range of wavelengths, where the HVL is greater than the first substrate first thickness.

14. A system employing a multipath coupled lens and a photodiode demultiplexer, the system comprising:
a lens comprising:
a first surface;
a second surface;
a first photodiode to accept optical signals from the lens first surface in a first range of wavelengths;
a second photodiode underlying the first photodiode to accept optical signals in a second range of wavelengths, longer than the first range, from the lens first surface;
two pass-through structures, each pass-through structure formed between the lens first and second surfaces, each pass-through structure having a first aperture formed in the first surface to accept a pass-through beam of light and a second aperture formed in the second surface to transmit the pass-through beam of light into free space, and where each pass-through structure is formed along a corresponding offset axis located between the first surface center and a first surface perimeter; and
two light sources to transmit a pass-through optical signals into free space towards a corresponding pass-through structure.

\* \* \* \* \*